(12) United States Patent
Cheng

(10) Patent No.: US 8,341,830 B2
(45) Date of Patent: Jan. 1, 2013

(54) QUICK CIRCUIT BOARD PRESS-MOUNT DEVICE

(75) Inventor: Ming-Feng Cheng, Keelung (TW)

(73) Assignee: Caswell Inc., New Taipei (TW)

( * ) Notice: Subject to any disclaimer, the term of this patent is extended or adjusted under 35 U.S.C. 154(b) by 0 days.

(21) Appl. No.: 13/118,150

(22) Filed: May 27, 2011

(65) Prior Publication Data

US 2011/0289768 A1 Dec. 1, 2011

(30) Foreign Application Priority Data

May 28, 2010 (TW) .............................. 99210122 U

(51) Int. Cl.
*H05K 7/14* (2006.01)
(52) U.S. Cl. .......................................... 29/758; 361/754
(58) Field of Classification Search ..................... 29/729, 29/758, 762, 764; 403/342; 361/754
See application file for complete search history.

(56) References Cited

U.S. PATENT DOCUMENTS

| 4,109,379 A | * | 8/1978 | Ratti et al. ....................... 29/747 |
| 4,223,934 A | * | 9/1980 | Cauceglia et al. .............. 294/15 |
| 4,377,907 A | * | 3/1983 | Bertellotti et al. .............. 29/747 |
| 6,802,117 B2 | * | 10/2004 | Dalisay ........................... 29/758 |
| 7,047,631 B1 | * | 5/2006 | Spaulding ........................ 29/832 |

FOREIGN PATENT DOCUMENTS

TW 453624 9/2001

* cited by examiner

*Primary Examiner* — Livius R Cazan
(74) *Attorney, Agent, or Firm* — Muncy, Geissler, Olds & Lowe, PLLC

(57) ABSTRACT

A quick circuit board press-mount device comprises: a positioning device, having a positioning board and a back board, and the positioning board having an adjusting knob with a screw rod portion, and the back board having an adjusting notch; an adjusting device, having a combining board, an insert board extended forward from the front end of the combining board, and the insert board having a screw hole for securing the screw rod portion, and the insert board being inserted into the adjusting notch, and the insert board having a lateral connecting board extended from a side from the combining board, and the lateral connecting board having an oblong adjusting slot for securing a position screw hole of the back board by a screw rod; and a press-mount element, coupled to the combining board, so that the circuit board module and the interface card can be mounted conveniently and quickly.

10 Claims, 8 Drawing Sheets

QUICK CIRCUIT BOARD PRESS-MOUNT DEVICE

BACKGROUND OF THE INVENTION

1. Field of the Invention

The present invention relates to a press-mount device; and more particularly to a quick circuit board press-mount device capable of pressing, fixing and positioning a computer circuit board module or an interface card conveniently and quickly, and achieving an excellent operating efficiency.

2. Brief Description of the Related Art

In general, various circuit board modules and interface cards are installed onto a computer, and a press-mount device is usually provided for fixing the circuit board modules and interface cards to prevent them from being loosened for falling out when the computer is operating in an environment with vibrations or during its transportation. With reference to FIG. 1 for a related prior art disclosed in R.O.C. Pat. No. 453624 and the figures related to this patent, the prior art comprises a support frame 2 and a plurality of screws 23, and a latch member 28 at an end of the support frame 2 is latched to a latch element 130 of a computer casing 1, and another end of the support frame 2 is fixed onto a screw hole 150 of the computer casing 1 by a penetrating hole 210 and a screw 211, and a rotating slot 25 is formed at an end (or top end) of the screw 23, and a press-mount member 26 is installed at another end (bottom end) of the screw 23, and the end of the screw 23 having the rotating slot 25 protruded and passed into the screw hole 21 of the support frame 2 and screwed with a fixing element 3, and a screwdriver is used for rotating the rotating slot (25), such that the screw 23 can be moved (up or down) along the screw hole 21 of the support frame 2 to adjust an appropriate height in order to press and position the interface card 110 by the press-mount member 26.

Although the aforementioned prior art can press and position the interface card 110 by adjusting the height of the screw 23, yet there are still drawbacks in its operation. For example, the screw 23 is passed into the screw hole 21 of the support frame 2 from bottom to top, and sheathed to a fixing element 3 (such as a nut), so that during the assembling process, the screw 23 and the fixing element 3 may be dropped into the computer casing 1 by accident easily, which will affect the assembling efficiency. In addition, after the screw 23 is used for press-mounting the interface card 110, the portion of the screw 23 protruded out from the fixing element 3 must be cut by a cutting tool, which is a destructive operation, not only taking much effort, but also incurring a poor efficiency and danger. There is always an issue of the cutting quality, and thus such design is not good enough. Furthermore, the cut portion of the screw 23 will be dropped anywhere in the computer casing 1, and it is necessary to search and remove the cut portion, which will waste time and lower the assembling efficiency, and after the remaining end of the rotating slot 25 of the screw 23 is cut, the screw 23 cannot be used for rotating and making adjustment anymore, and cause problems when it is necessary to repair or replace the interface card 110 next time. If the interface cards 110 have different heights, the screw 23 cannot be used for the press-mounting operation or making any adjustment. As a result, it is necessary to replace the whole set of the support frame 2 and fix all interface cards 110 again, and such arrangement definitely causes tremendous inconvenience to users. Obviously, the prior art requires improvement, and it is a main subject for manufacturers and designers of the related industry to overcome the existing problems of the prior art and improving the convenience and efficiency of assembling the computers.

SUMMARY OF THE INVENTION

In view of the aforementioned problems of the conventional structural design for press-mounting a circuit board, the inventor of the present invention based on years of experience in the related industry to conduct extensive researches and experiments, and finally developed a more efficient, convenient and space limitation-free quick circuit board press-mount device to overcome the problems of the prior art.

Therefore, it is a primary objective of the present invention to provide a quick circuit board press-mount device, capable of press-mounting a computer circuit board module, or an interface card conveniently and quickly, so as to enhance the operation of assembling computers.

Another objective of the present invention is to provide a quick circuit board press-mount device to overcome the drawbacks of the conventional circuit board being pressed and positioned with a limited spatial requirement, and requiring a limited pre-pressed height of the circuit board and different sizes of press board straps, so that the invention can achieve the effects of changing the component modules to fit the insufficient space flexibly, simplifying the assembling procedure, and saving the assembling time and labor.

To achieve the aforementioned objectives, the present invention provides a technical measure comprising: a positioning device, including a positioning board and a back board, and the positioning board having an adjusting through hole formed thereon, and a positioning screw block being disposed on a side of the adjusting through hole, an adjusting knob being pivotally installed into the adjusting through hole, and a screw rod portion being formed at the bottom of the adjusting knob, and an adjusting notch being formed on the back board, and a positioning screw hole formed on a side of the adjusting notch; an adjusting device, including a combining board, an insert board extended forward from a front end of the combining board, and the insert board having a screw hole for securing the screw rod portion, and the insert board being inserted into the adjusting notch, and the insert board having a lateral connecting board installed at a lateral side of the insert board and rotated and extended from the combining board, and the lateral connecting board having an oblong adjusting slot for positioning the screw hole at the back board by a screw rod; and a press-mount element, coupled to the combining board.

The technical contents of the present invention will become apparent by the detailed description of the preferred embodiments together with the illustration of related drawings as follows:

BRIEF DESCRIPTION OF THE INVENTION

Figure 5:
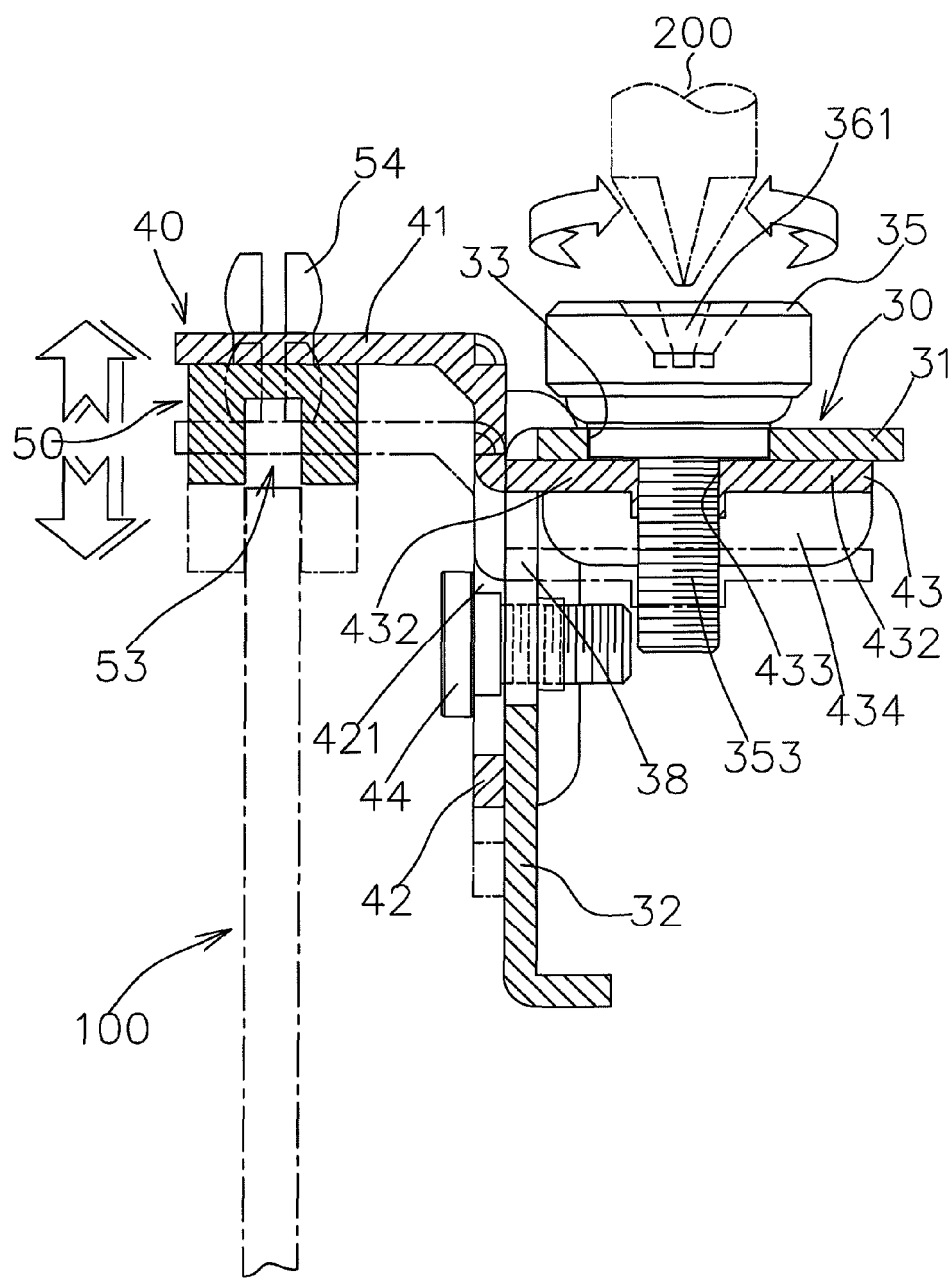
Figure 6:
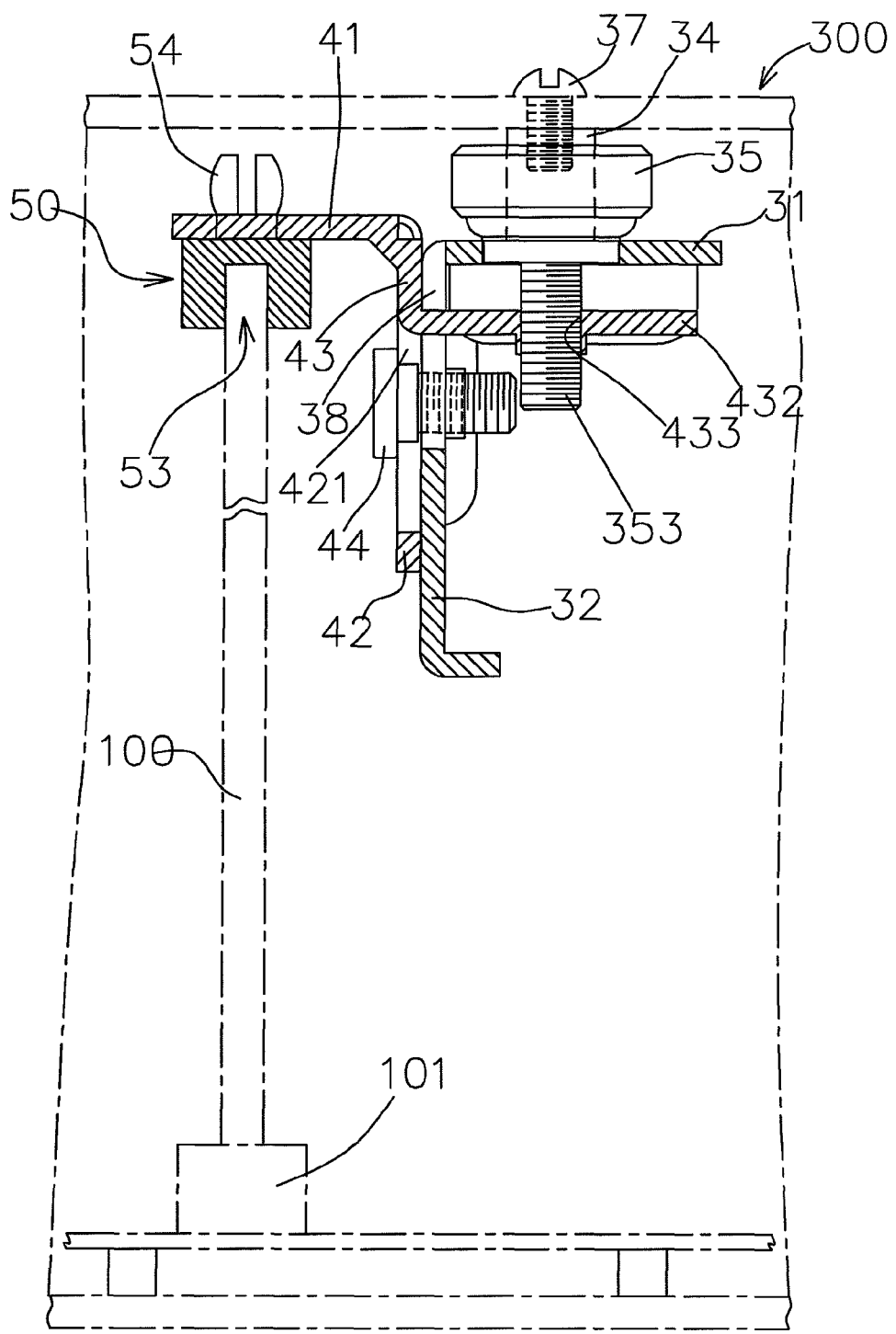
Figure 7:
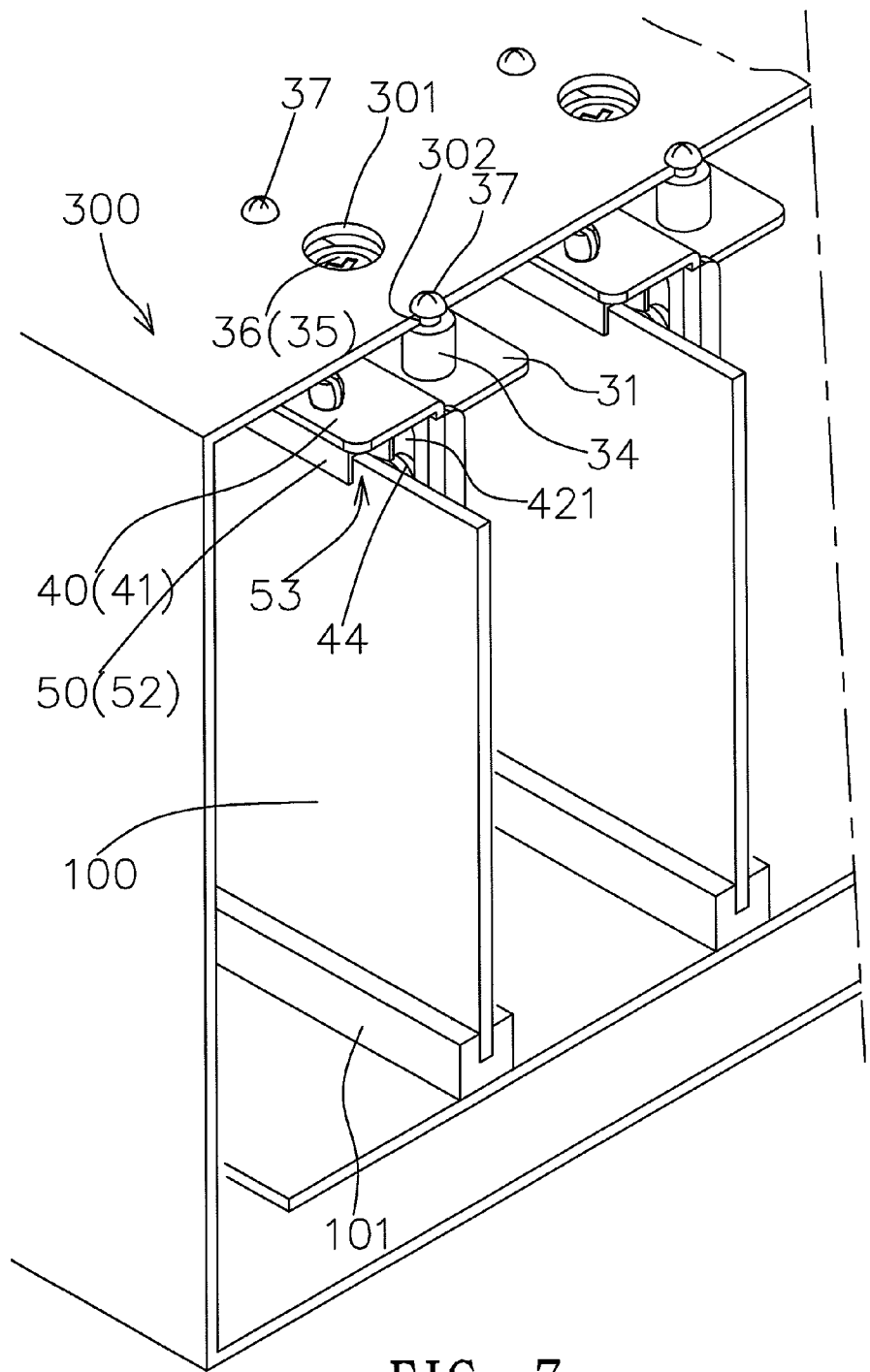
Figure 8:
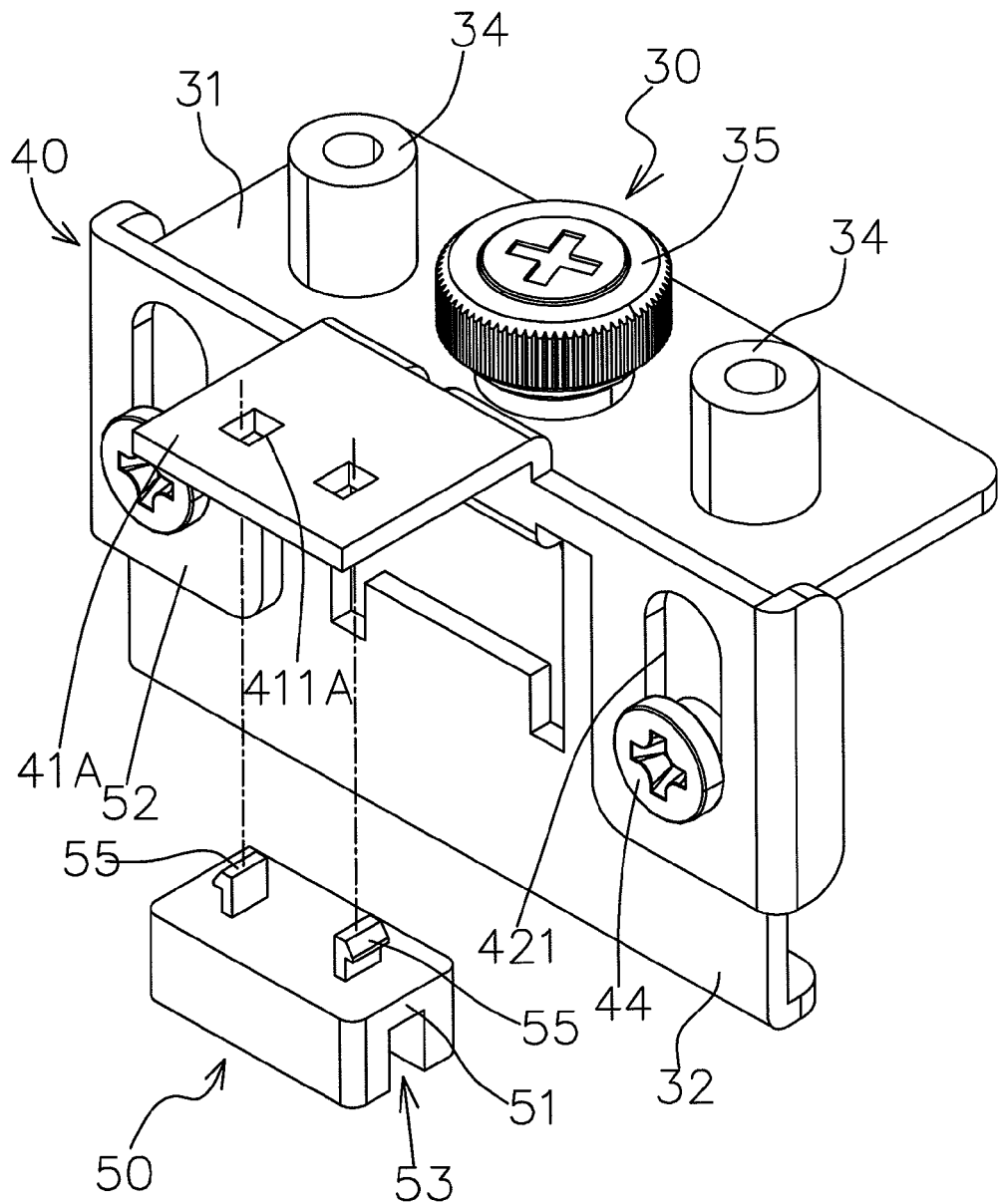

FIG. 4A a cross-sectional view of the first embodiment of the present invention;

FIG. 5 is a schematic view of an operation in accordance with the first embodiment of the present invention;

FIG. 6 is a cross-sectional view of an application in accordance with the first embodiment of the present invention;

FIG. 7 is a perspective view of an application in accordance with the first embodiment of the present invention; and FIG. 8 is a perspective view of the second embodiment of the present invention.

DETAILED DESCRIPTION OF THE PREFERRED EMBODIMENTS

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

Figure 1:
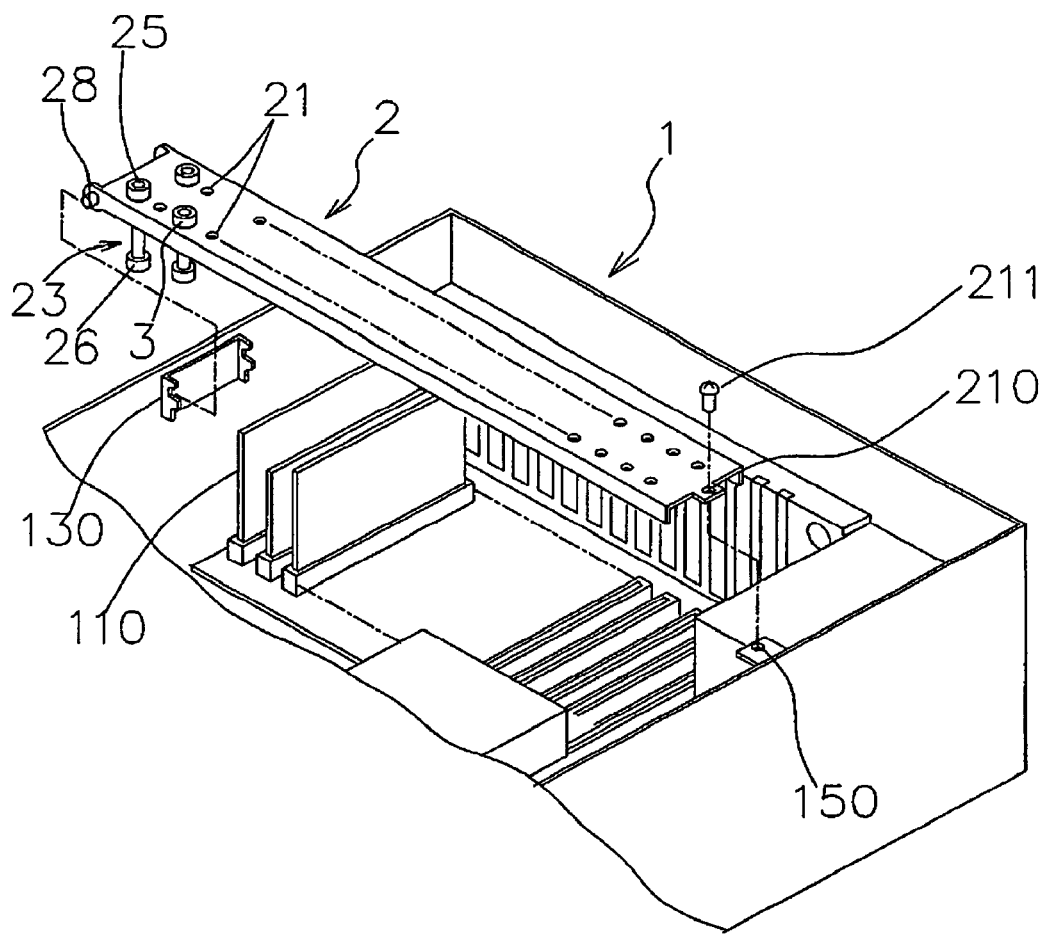
FIG. 1 is a schematic view of a conventional quick circuit board press-mount device.
Figure 2:
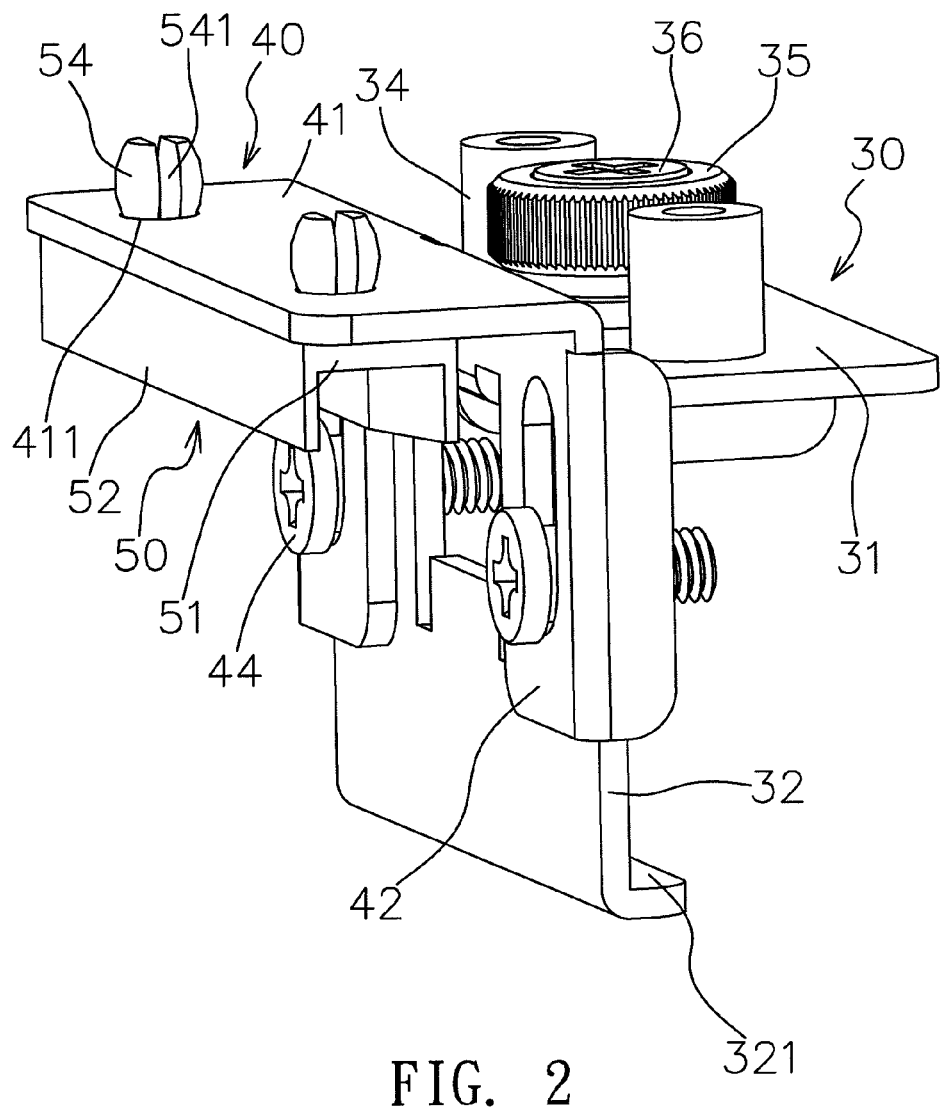
FIG. 2 is a perspective view of the first embodiment of the present invention.
Figure 3:
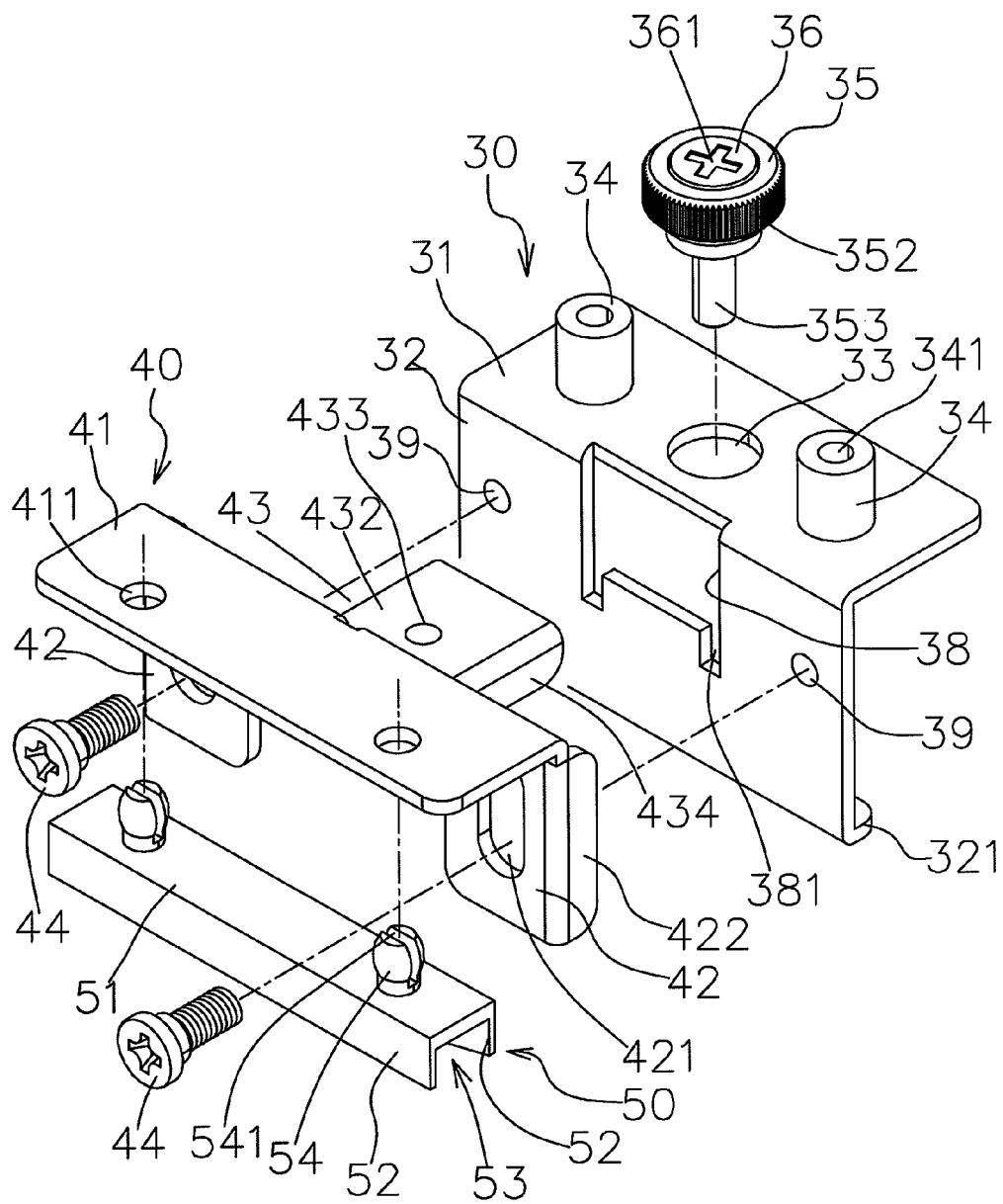
FIG. 3 is an exploded view of the first embodiment of the present invention.

With reference to FIGS. 2 and 3 for a quick circuit board press-mount device in accordance with a first preferred embodiment of the present invention, the quick circuit board press-mount device comprises a positioning device 30, an adjusting device 40 and a press-mount element 50; the positioning device 30 includes a positioning board 31 and a back board 32 coupled perpendicularly to one another, and the positioning board 31 includes an adjusting through hole 33 formed separately on both sides of the positioning screw block 34, and a center screw hole 341 formed on a center position of the positioning screw block 34, and an adjusting knob 35 is pivotally installed into the adjusting through hole 33, and an adjusting portion 36 is disposed at the center position of the adjusting knob 35, and the adjusting portion 36 includes an adjusting groove 361 operated with a tool for a rotating and adjusting operation (which will be described in details below). In addition, the adjusting knob 35 includes a plurality of wavy lines 352 formed at the periphery of the adjusting knob 35, and a screw rod portion 353 formed at the bottom of the adjusting knob 35. The back board 32 is extended downwardly from the positioning board 31 (as indicated in the direction of FIG. 2), and the back board 32 includes an adjusting notch 38 formed at the center position of the back board 32 and a fixing screw hole 39 formed separately on both sides of the adjusting notch 38, and the adjusting notch 38 includes a lateral guide slot 381 formed separately on both sides of the bottom of the adjusting notch 38, and an end board 321 is extended forwardly and perpendicularly from the back board 32 (as indicated by the direction of FIG. 2).

Figure 4:
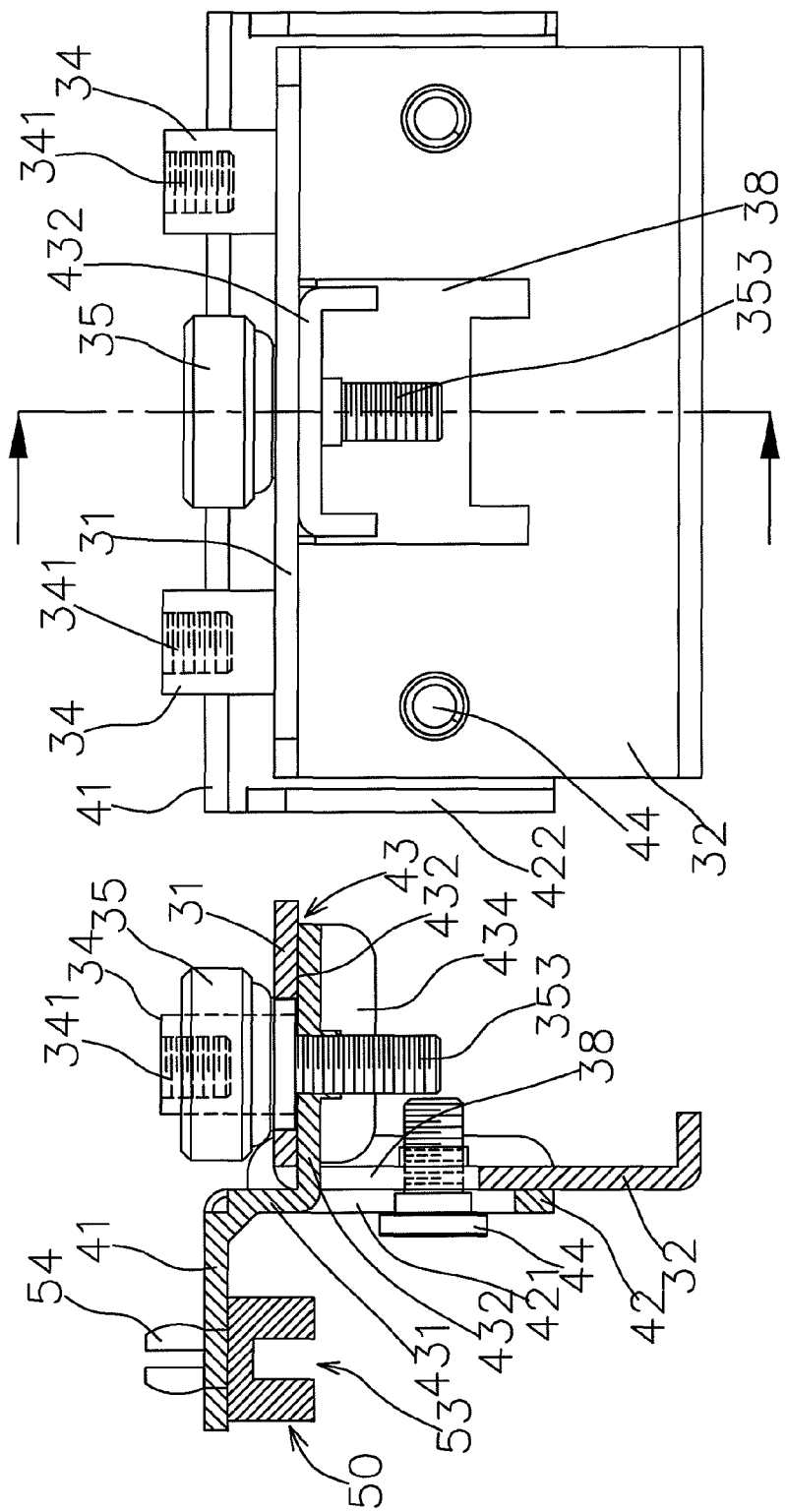
FIG. 4 is a side view of the first embodiment of the present invention.

The adjusting device 40 includes a combining board 41, a latching hole 411 formed separately on both sides of the combining board 41, a connecting portion 43 extended downwardly from a front end of the combining board 41, and the lateral connecting board 42 on both sides of the connecting portion 43 including connecting board 431 of the combining board 41 perpendicular to each other, and the connecting board 431 has an insert board 432 extended forwardly in a perpendicular direction. The insert board 432 includes a screw hole 433 at the center position and a lateral guide board 434 separately extended perpendicularly from both sides of the insert board 432 and corresponding to the lateral guide slot 381. The lateral connecting board 42 includes an oblong adjusting slot 421, and the lateral connecting board 42 includes a distal protective board 422 protruded forwardly from an edge of the lateral connecting board 42. During the assembling process, the insert board 432 is inserted into the adjusting notch 38 of the back board 32, and the screw rod 44 is used to secure the adjusting slot 421 and the positioning screw hole 39, and the screw rod portion 353 of the adjusting knob 35 is screwed to the screw hole 433 of the insert board 432, such that the positioning device 30 and the adjusting device 40 are coupled to each other as shown in FIGS. 4 and 4A.

The press-mount element 50 includes a press board 51 and a side board 52 extended downwardly from both sides of the press board 51, wherein a press slot 53 is formed at the center position of the press slot 53, and a latching element 54 is protruded separately from both sides of the top of the press board 51, and the latching element 54 has an elastic slot 541 formed thereon and the latching element 54 can be inserted into the latching hole 411 of the combining board 41, such that the press-mount element 50 is positioned at the bottom of the rear side of the combining board 41.

With reference to FIGS. 5 to 7 for a quick circuit board press-mount device installed in a casing 300 in accordance with the present invention, the positioning screw block 34 of the positioning board 31 is passed through and secured into the fixing hole 302 at the top of the casing 300 by the bolt 37, and the casing 300 includes an operating hole 301 corresponding to the adjusting knob 35. Now, the press slot 53 of the press-mount element 50 is corresponsive to the circuit board module 100 (or interface card) inserted into the connecting slot 101. If a screwing tool 200 (as shown in FIGS. 5 and 7) is passed through the operating hole 301 of the casing 300 to rotate the adjusting knob 35, and ascend or descend the screw rod portion 353 of the insert board 432 by rotations. In other words, the oblong adjusting slot 421 of the lateral connecting board 42 is used to pass the screw rod 44 to obtain the space for ascending, descending or adjusting the adjusting device 40. Since the press-mount element 50 can be ascended or descended with the adjusting device 40, therefore the height of the press slot 53 can be adjusted to press and mount the circuit board module 100 (or interface card) in order to fix the upper and lower ends of the circuit board module 100 (interface card) into stable positions.

When the quick circuit board press-mount device of the present invention is assembled to the casing 300, its operating surface is at the top of the casing 300, and the height of the press-mount element 50 is adjusted simply by using a screwing tool 200 to rotate the adjusting knob 35 with respect to the operating hole 301 at the top of the casing 300, so that the screws will not be dropped into the casing 300, and the circuit board module and interface cards can be press-mounted very conveniently and quickly, so as to enhance the efficiency of assembling the computers. In addition, the design of the present invention can press and fix a circuit board (or module) effectively to reduce the low yield rate of the conventional assembling process.

With reference to FIG. 8 for a quick circuit board press-mount device in accordance with the second preferred embodiment of the present invention, the second preferred embodiment is substantially the same as the first preferred embodiment, except that the press board 51 of the press-mount element 50 has a latching element 55 which is an oblique block protruded separately from both sides of the top of the press board 51, and the combining board 41A includes a latching hole 411A formed thereon for latching the corresponding latching element 55, while pressing the two latching elements 55 to release the press-mount element 50 and the combining board 41A of the adjusting device 40 to facilitate separating them.

In this preferred embodiment, the length of the combining board 41A and the press-mount element 50 can be adjusted or shortened flexibly, such that the circuit board can be pressed and positioned without being limited by space to provide the advantage of adjusting or changing component modules to flexibly fit the insufficient space.

In summation of the description above, the present invention complies with the patent application requirements, and is thus duly filed for patent application. While the invention has been described with reference to a preferred embodiment thereof, it is to be understood that modifications or variations may be easily made without departing from the spirit of this invention, which is defined in the appended claims.

What is claimed is:

1. A quick circuit board press-mount device, comprising:
a positioning device, including a positioning board and a back board, and the positioning board having an adjusting through hole formed therein, and a positioning screw block being disposed on a side of the adjusting through hole, an adjusting knob having an adjusting portion disposed at an end of the adjusting knob and further having a screw rod portion formed at an opposite end of the adjusting knob, and the screw rod portion being pivotally installed into the adjusting through hole, and an adjusting notch being formed on the back board, and a positioning screw hole formed on a side of the adjusting notch;
an adjusting device, including a combining board, and an insert board extended from a lateral side of the combining board toward the adjusting notch and further being inserted into the adjusting notch, and the insert board having a screw hole for securing the screw rod portion, and the insert board further having a lateral connecting board installed at a lateral side thereof and rotated at an angle relative to and extended from the combining board, and the lateral connecting board having an oblong adjusting slot;
a screw rod used to secure the oblong adjusting slot and the screw hole of the back board; and
a press-mount element, coupled to the combining board.

2. The quick circuit board press-mount device of claim 1, wherein the positioning board and the back board are coupled perpendicularly to one another.

3. The quick circuit board press-mount device of claim 1, wherein the adjusting knob includes an adjusting groove formed at the center position of the adjusting knob for operating with a tool to perform a rotating operation.

4. The quick circuit board press-mount device of claim 1, wherein the adjusting knob includes a plurality of wavy lines formed at the periphery of the adjusting knob for facilitating rotating the adjusting knob.

5. The quick circuit board press-mount device of claim 1, wherein the adjusting notch includes a lateral guide slot separately formed on both sides of the adjusting notch, and the insert board includes a lateral guide board separately disposed on both sides of the insert board and corresponding to the lateral guide slots respectively.

6. The quick circuit board press-mount device of claim 1, wherein the combining board includes a latching hole formed separately on both sides of the combining board and the press mount element includes a latching element disposed separately on both sides of the press mount element and corresponding to the latching holes.

7. The quick circuit board press-mount device of claim 6, wherein the press-mount element comprises a press board, and a latching element installed separately on both ends of the press board and corresponding to the latching holes, and the press board has a side board and a press slot formed on a side of the press board opposite the side with the latching elements thereon.

8. The quick circuit board press-mount device of claim 6, wherein each latching element is substantially an oblique block provided for loosening and separating the press-mount element from the adjusting device when the two latching elements are pressed.

9. The quick circuit board press-mount device of claim 1, wherein the combining board includes a lateral connecting board extended from a lateral side facing the back board, and extended further perpendicularly downward into a direction parallel to the connecting board, and the insert board is formed by extending the connecting board vertically forward relative to the connecting board.

10. The quick circuit board press-mount device of claim 1, provided in a casing for installing the quick circuit board press-mount device, a fixing hole and an operating hole formed at the top of the casing and corresponding to the positioning screw block and the adjusting knob respectively.

* * * * *